United States Patent [19]

Brooks et al.

[11] Patent Number: 5,359,296
[45] Date of Patent: Oct. 25, 1994

[54] SELF-BIASED CASCODE CURRENT MIRROR HAVING HIGH VOLTAGE SWING AND LOW POWER CONSUMPTION

[75] Inventors: Todd L. Brooks; Mathew A. Rybicki, both of Austin, Tex.

[73] Assignee: Motorola Inc., Schaumburg, Ill.

[21] Appl. No.: 119,940

[22] Filed: Sep. 10, 1993

[51] Int. Cl.⁵ .............................. H03F 3/16
[52] U.S. Cl. .................... 330/288; 330/296
[58] Field of Search ............ 330/277, 288, 296, 310; 307/296.1; 323/315, 316

[56] References Cited

U.S. PATENT DOCUMENTS

| | | | |
|---|---|---|---|
| 5,087,891 | 2/1992 | Cytera | 330/288 |
| 5,099,205 | 3/1992 | Lewyn | 330/288 |
| 5,134,310 | 7/1992 | Mobley et al. | 330/288 X |
| 5,142,696 | 8/1992 | Kosiec et al. | 455/260 |

Primary Examiner—Steven Mottola
Attorney, Agent, or Firm—Daniel D. Hill

[57] ABSTRACT

A self-biased cascode current mirror includes a current mirror (60), and a cascode bias generator (50). The cascode bias generator (50) includes a resistor (51) to provide a bias voltage for the current mirror (60). The current mirror (60) includes cascode transistor (64) and two mirror transistors (62, 63). The bias voltage is approximately equal to a minimum saturation voltage of the cascode transistor (64) plus a gate-source voltage of the transistor (63) of the current mirror (60). The self-biased cascode current mirror (60) has a high output impedance and high voltage swing while providing low power consumption and requiring a small layout area.

7 Claims, 1 Drawing Sheet

SELF-BIASED CASCODE CURRENT MIRROR HAVING HIGH VOLTAGE SWING AND LOW POWER CONSUMPTION

FIELD OF THE INVENTION

This invention relates to current mirrors, and more particularly, to a self-biased cascode current mirror having high voltage swing and low power consumption.

BACKGROUND OF THE INVENTION

Current mirrors are often used in analog circuits to replicate signal and bias currents. A current mirror may be characterized as having an output impedance which affects the accuracy of the current replicated in the current mirror. High output impedance in current mirrors is required for accurate replication of currents. In order to obtain a high output impedance, known current mirrors utilize cascode transistors. A current mirror may also be characterized as having an output voltage swing. High voltage swing in current mirrors is desired for accurate operation with low power supply voltages and for increased voltage signal amplitudes which improve the accuracy of analog circuitry utilizing the current mirrors.

FIG. 1 illustrates in schematic diagram form prior art high-swing cascode current mirror 10. High-swing cascode current mirror 10 includes current mirror 30 and cascode bias generator 20. Current mirror 30 includes N-channel cascode transistors 31 and 34 and N-channel transistors 32 and 33. N-channel transistor 31 has a source, a gate for receiving a bias voltage labeled "$C_{NBIAS}$", and a drain coupled to current source 23 for receiving an input current labeled "$I_{IN}$". N-channel transistor 32 has a source connected to a power supply voltage terminal labeled "$V_{SS}$", a gate connected to the drain of transistor 31, and a drain connected to the source of transistor 31. N-channel transistor 34 has a source, a gate for receiving bias voltage $C_{NBIAS}$, and a drain for providing an output current labeled "$I_{OUT}$". N-channel transistor 33 has a source connected to $V_{SS}$, a gate connected to the drain of N-channel transistor 31, and a drain connected to the source of transistor 34.

Cascade bias generator 20 includes N-channel transistor 21 and current source 22. Current source 22 has a first terminal connected to $V_{DD}$, and a second terminal. Diode-connected N-channel transistor 21 has a source connected to $V_{SS}$, a drain connected to the second terminal of current source 22 for providing bias voltage $C_{NBIAS}$, and a gate connected to its drain.

Current mirror 30 is a conventional cascode current mirror which has high output impedance. The drain of cascode transistor 34 is the output terminal of prior art high-swing cascode current mirror 10. Cascade transistor 34 enhances the output impedance of the current mirror by reducing the voltage variation between the drain and source of transistor 33. Cascade transistor 31 maintains the same drain-source voltage drop across N-channel transistor 32 as that across N-channel transistor 33, which improves the current mirroring accuracy. Each of the transistors in prior art high-swing cascode current mirror 10 may be sized to minimize an excessive drain-source voltage drop across transistor 33 in order to provide a wide voltage swing at the output of the current mirror. For this reason prior art high-swing cascode current mirror 10 is useful in applications requiring either wide dynamic range or low voltage operation. The voltage swing at the output of prior art high-swing cascode current mirror 10 increases as bias voltage $C_{NBIAS}$ is reduced. However, bias voltage $C_{NBIAS}$ should be large enough to ensure that N-channel transistors 32 and 33 operate in saturation and that high output impedance is maintained. Therefore, the greatest output voltage swing that can be obtained while maintaining high output impedance occurs when bias voltage $C_{NBIAS}$ is equal to the sum of the gate voltage of N-channel transistor 33 and the minimum saturation voltage ($V_{DSAT}$) of cascode N-channel transistor 34. The minimum saturation voltage is the minimum drain-source voltage that causes the transistor to operate in the saturation region.

Cascade bias generator 20 generates bias voltage $C_{NBIAS}$ using the gate-source voltage of diode-connected N-channel transistor 21. The current flow required in N-channel transistor 21 and current source 22 to generate bias voltage $C_{NBIAS}$ contributes a significant amount of the total power consumption of prior art high-swing cascode current mirror 10. In addition, cascode bias generator 20 requires additional layout area which makes the circuit more expensive to manufacture. Thus, a new high-swing current mirror is needed to decrease the power consumption, layout area, and manufacturing expense of analog circuits.

SUMMARY OF THE INVENTION

Accordingly, there is provided, in one form, a self-biased cascode current mirror circuit that includes a resistive element, and first, second, and third transistors. The resistive element has a first terminal for providing a bias voltage in response to receiving an input current, and a second terminal. The first transistor has a first current electrode and a control electrode connected to the second terminal of the resistive element, and a second current electrode coupled to a power supply voltage terminal. The second transistor having a first current electrode for providing an output current, a control electrode coupled to the first terminal of the resistive element for receiving the bias voltage, and a second current electrode. The third transistor has a first current electrode coupled to the second current electrode of the second transistor, a control electrode coupled to the first current electrode of the first transistor, and a second current electrode coupled to the power supply voltage terminal. These and other features and advantages will be more clearly understood from the following detailed description taken in conjunction with the accompanying drawings.

DESCRIPTION OF A PREFERRED EMBODIMENT

Figure 1:
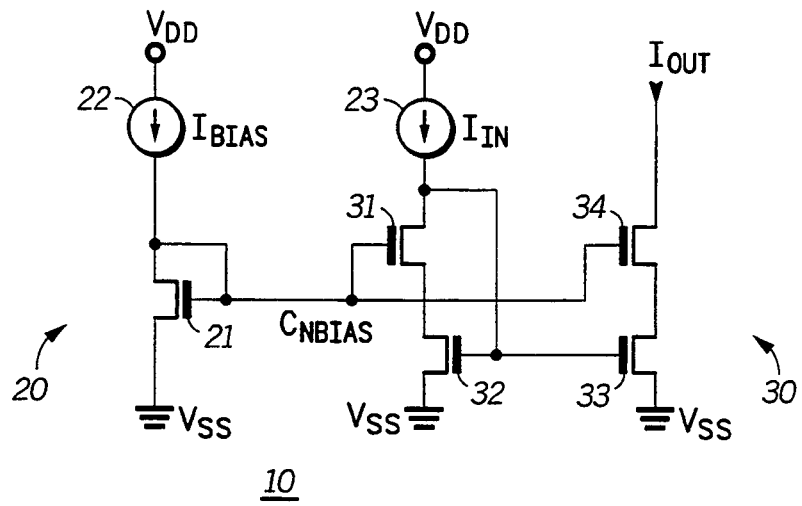
FIG. 1 illustrates in schematic diagram form a prior art high-swing cascode current mirror.
Figure 2:
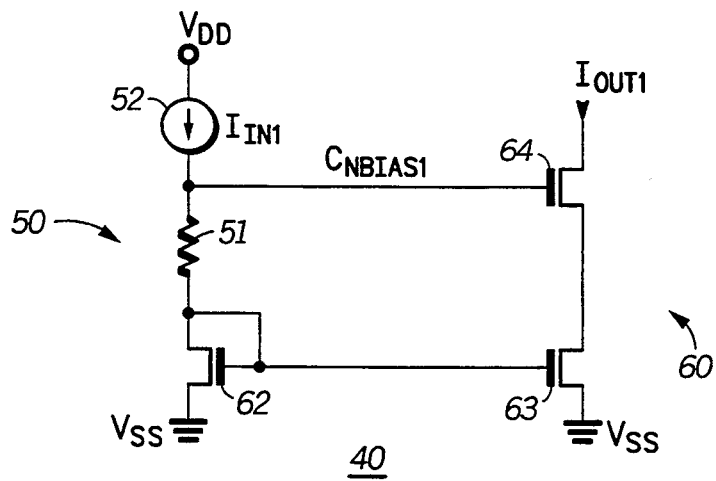
FIG. 2 illustrates in schematic diagram form a self-biased cascode current mirror in accordance with one embodiment of the present invention.

FIG. 2 illustrates in schematic diagram form, self-biased cascode current mirror 40 in accordance with one embodiment of the present invention. Self-biased cascode current mirror 40 includes current mirror 60 and cascode bias generator 50. Current mirror 60 includes N-channel cascode transistor 64, N-channel diode-connected transistor 62, and N-channel transistor 63. N-channel transistor 62 has a source connected to power supply voltage terminal $V_{SS}$, and the drain of N-channel transistor 62 is connected to a gate thereof. N-channel cascode transistor 64 has a source, a gate for receiving a bias voltage labeled "$C_{NBIAS1}$", and a drain for providing an output current labeled "$I_{OUT1}$". N-channel transistor 63 has a source connected to $V_{SS}$, a gate connected to the drain of transistor 62, and a drain connected to the source of N-channel transistor 64.

Figure 3:
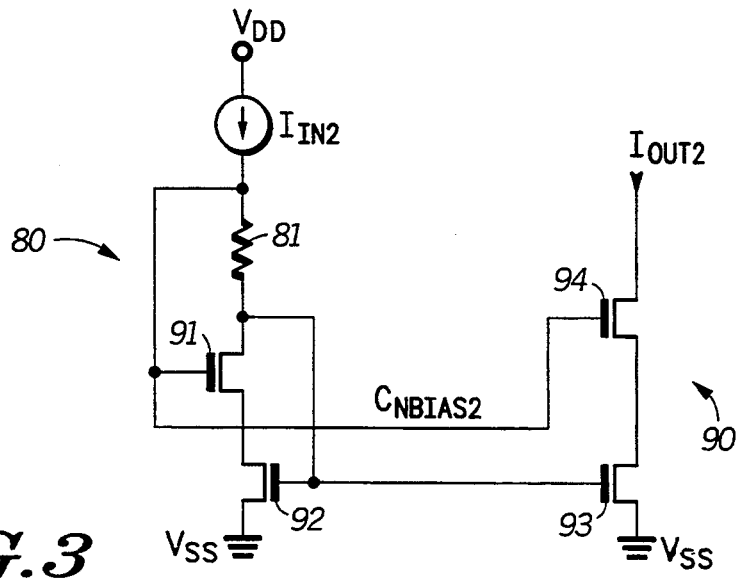
FIG. 3 illustrates in schematic diagram form a self-biased cascode current mirror in accordance with another embodiment of the present invention.

Current source 52 has a first terminal connected to power supply voltage terminal $V_{DD}$, and a second terminal connected to the first terminal of resistor 51 for providing a current labeled "$I_{IN1}$". Cascade bias generator 50 includes resistor 51. Resistor 51 has a first terminal for receiving an input current labeled $I_{IN1}$ from current source 52, the first terminal also providing bias voltage $C_{NBIAS1}$, and a second terminal connected to the gate of N-channel transistor 62. In a preferred embodiment, $V_{DD}$ receives a positive power supply voltage and $V_{SS}$ receives zero volts, or ground potential. However, in other embodiments $V_{DD}$ and $V_{SS}$ may receive other voltages. Also, each of the transistors in the embodiments of FIG. 2 and FIG. 3 are N-channel MOSFETs (metal-oxide semiconductor field-effect transistors). In other embodiments, the circuits of FIG. 2 and FIG. 3 may be implemented using P-channel transistors.

Current mirror 60 is a conventional cascode current mirror which provides high output impedance. Cascade N-channel transistor 64 enhances the output impedance by reducing the voltage variation between the drain and source of N-channel transistor 63. The voltage swing at the drain of N-channel transistor 64 increases as bias voltage $C_{NBIAS1}$ decreases. However, bias voltage $C_{NBIAS1}$ at the gate of N-channel transistor 64 should be at least equal to a $V_{DSAT}$ voltage drop greater than the voltage at the gate of N-channel transistors 62 and 63, plus the $V_T$ of N-channel transistor 64 minus the $V_T$ of N-channel transistor 63, to ensure that these devices operate in saturation and that the current mirror maintains a high output impedance. Therefore, in order to obtain the largest voltage swing that can be obtained while maintaining a high current mirror output impedance, bias voltage $C_{NBIAS1}$ is set equal to the gate voltage of N-channel transistor 63, plus the $V_{DSAT}$ voltage drop of cascode N-channel transistor 64, plus the threshold voltage ($V_T$) of N-channel transistor 64 minus the $V_T$ of N-channel transistor 63.

Cascade bias generator 50 generates bias voltage $C_{NBIAS1}$ using resistor 51. The largest output voltage swing with high current mirror output impedance is obtained by setting the voltage drop across resistor 51 equal to the $V_{DSAT}$ voltage of cascode N-channel transistor 64, plus the $V_T$ of N-channel transistor 64 minus the $V_T$ of N-channel transistor 63. In a preferred embodiment, the voltage drop across resistor 51 is less than a few hundred millivolts. Therefore, resistor 51 may be implemented in an integrated circuit with manufacturable resistance values in the range of about 100 ohms to about 20 kiloohms to provide optimal cascade bias voltages for currents in the range of about 10 microamps to about 1 milliamp. However, the resistance range may be different in other applications. The current flow in resistor 51 is also used in current mirror 60 providing the advantage of no additional power consumption in self-biased cascode current mirror 40. The number of devices, as well as the power consumption of self-biased cascode current mirror 40 is reduced from that of prior art high-swing cascode current mirror 10. Since fewer devices are required for self-biased cascode current mirror 40, the layout area may be smaller than that required for prior art high-swing cascode current mirror 10 for a given process technology.

FIG. 3 illustrates in schematic diagram form self-biased cascode current mirror 70 in accordance with another embodiment of the present invention. Self-biased cascode current mirror 70 includes current mirror 90 and cascode bias generator 80. Current mirror 90 includes N-channel cascode transistors 91 and 94 and N-channel transistors 92 and 93. N-channel transistor 91 has a source, a gate for receiving a bias voltage labeled "$C_{NBIAS2}$", and a drain for receiving an input current labeled "$I_{IN2}$". N-channel transistor 92 has a source connected to power supply voltage terminal $V_{SS}$, a gate connected to the drain of N-channel transistor 91, and a drain connected to the source of N-channel transistor 91. N-channel transistor 94 has a source, a gate for receiving bias voltage $C_{NBIAS2}$, and a drain for providing an output current labeled "$I_{OUT2}$". N-channel transistor 93 has a source connected to $V_{SS}$, a gate connected to the drain of N-channel transistor 91, and a drain connected to the source of N-channel transistor 94. Cascade bias generator 80 includes resistor 81. Resistor 81 has a first terminal for receiving an input current, $I_{IN2}$, and providing a bias voltage $C_{NBIAS2}$, and a second terminal connected to the gate of N-channel transistor 92.

Current mirror 90 is a conventional cascode current mirror which provides high output impedance. Cascade N-channel transistor 94 enhances the output impedance of the mirror by reducing the voltage variation between the drain and source of N-channel transistor 93. Cascade N-channel transistor 91 maintains a drain-source voltage drop across N-channel transistor 92 that is approximately equal to a drain-source voltage drop across N-channel transistor 93, and thus improves the current mirroring accuracy at the expense of requiring more layout area. The voltage swing at the drain of N-channel transistor 94 of current mirror 90 increases as bias voltage $C_{NBIAS}$ is decreased. However, bias voltage $C_{NBIAS2}$ at the gates of N-channel transistors 91 and 94 should be at least a $V_{DSAT}$ voltage drop greater than the voltage at the gate of N-channel transistors 92 and 93, plus the $V_T$ of N-channel transistor 94 minus the $V_T$ of N-channel transistor 93, to ensure that N-channel transistors 91 and 94 operate in saturation and that self-biased cascode current mirror 70 maintains high output impedance. Therefore, in order to obtain the largest voltage swing that can be obtained while maintaining a high output impedance, bias voltage $C_{NBIAS2}$ is equal to approximately the gate voltage of N-channel transistor 93, the $V_{DSAT}$ voltage drop of cascode N-channel transistor 94, plus the $V_T$ of N-channel transistor 94 minus the $V_T$ of N-channel transistor 93.

Cascade bias generator 80 generates bias voltage $C_{NBIAS}$ using resistor 81. The greatest output voltage swing with high current mirror output impedance is obtained by setting the voltage drop across resistor 81 equal to the $V_{DSAT}$ voltage of cascade N-channel transistor 94, plus the $V_T$ of N-channel transistor 94 minus the $V_T$ of N-channel transistor 93. The voltage drop across resistor 81 is less than a few hundred millivolts in typical current mirror implementations. Therefore, resistor 81 may be implemented with manufacturable resistance values in the range of about 100 ohms to about 20 kiloohms to provide optimal cascode bias voltages for typical currents in the range of 10 microamps to about 1 milliamp. However, the resistance range may be different in other applications. The current flow in resistor 81 is also used in current mirror 90 and therefore no additional power consumption is required in self-biased cascode current mirror 70. The number of devices and power consumption of self-biased cascode current mirror 70 is reduced from that of prior art high-swing cascode current mirror 10. The layout area of the invention may also be made smaller than that of prior art high-swing cascode current mirror 10 for a given process technology.

While the invention has been described in the context of a preferred embodiment, it will be apparent to those skilled in the art that the present invention may be modified in numerous ways and may assume many embodiments other than that specifically set out and described above. For example, resistors 51 and 81 may be replaced with a MOSFET operating in the linear region, or a bipolar transistor operating in saturation. Accordingly, it is intended by the appended claims to cover all modifications of the invention which fall within the true spirit and scope of the invention.

What is claimed is:

1. A self-biased cascode current mirror circuit, comprising:

a resistive element having a first terminal for providing a bias voltage in response to receiving an input current, and a second terminal;

a first transistor having a first current electrode coupled to the second terminal of the resistive element, a control electrode coupled to the first terminal of the resistor for receiving the bias voltage, and a second current electrode;

a second transistor having a first current electrode coupled to the second current electrode of the first transistor, a control electrode coupled to the first current electrode of the first transistor, and a second current electrode coupled to a power supply voltage terminal;

a third transistor having a first current electrode for providing an output current, a control electrode for receiving the bias voltage, and a second current electrode; and a fourth transistor having a first current electrode coupled to the second current electrode of the third transistor, a control electrode coupled to the first current electrode of the first transistor, and a second current electrode coupled to the power supply voltage terminal.

2. The current mirror circuit of claim 1, wherein said first, second, third, and fourth transistors are metal oxide semiconductor field effect transistors.

3. The current mirror circuit of claim 1, wherein said first, second, third, and fourth transistors are N-channel transistors.

4. The current mirror circuit of claim 1, wherein the power supply voltage terminal is characterized as being coupled to ground potential.

5. The current mirror circuit of claim 1, further comprising a current source having a first terminal coupled to a second power supply voltage terminal, and a second terminal coupled to the first terminal of the resistor, the current source for providing the input current.

6. The current mirror circuit of claim 1, wherein the bias voltage is equal to approximately the sum of a voltage at the gate of the fourth transistor and the minimum saturation voltage of the third transistor.

7. The current mirror circuit of claim 1, wherein the resistive element is a resistor.

* * * * *

UNITED STATES PATENT AND TRADEMARK OFFICE
CERTIFICATE OF CORRECTION

PATENT NO. : 5,359,296
DATED : October 25, 1994
INVENTOR(S) : Todd L. Brooks, Mathew A. Rybicki It is certified that error appears in the above-indentified patent and that said Letters Patent is hereby corrected as shown below:

Claim 1, Column 5, Line 36;
    delete "resistor" and insert --resistive element--.

Claim 6, Column 6, Line 33;
    change "the" to --a--.

Signed and Sealed this

Seventh Day of March, 1995

Attest:

BRUCE LEHMAN

Attesting Officer     Commissioner of Patents and Trademarks